(12) United States Patent
Smith

(10) Patent No.: US 6,771,076 B1
(45) Date of Patent: Aug. 3, 2004

(54) METHOD AND APPARATUS FOR MEASUREMENT OF LENGTH OF CABLE HAVING FIXED IMPEDANCE

(76) Inventor: Andrew L. Smith, 232 N. Mill View Way, Poute Vedra Beach, FL (US) 32082

( * ) Notice: Subject to any disclaimer, the term of this patent is extended or adjusted under 35 U.S.C. 154(b) by 0 days.

(21) Appl. No.: 09/893,695

(22) Filed: Jun. 29, 2001

Related U.S. Application Data

(60) Provisional application No. 60/215,755, filed on Jun. 30, 2000.

(51) Int. Cl.[7] ............................................. G01R 31/11
(52) U.S. Cl. ...................................................... 324/533
(58) Field of Search .................................. 324/527, 533, 324/539, 658, 667, 67.1, 674, 676, 699; 702/86, 97, 158

(56) References Cited

U.S. PATENT DOCUMENTS

| | | |
|---|---|---|
| 4,013,948 A | 3/1977 | Tanaka et al. ............... 324/534 |
| 4,165,482 A | 8/1979 | Gale ............................ 324/523 |
| 4,241,305 A | 12/1980 | Dickerson .................... 324/532 |
| 4,499,417 A | 2/1985 | Wright et al. ................ 324/533 |
| 4,739,276 A | 4/1988 | Graube ......................... 324/534 |
| 5,128,619 A | 7/1992 | Bjork et al. ................. 324/533 |
| 5,309,647 A | 5/1994 | Kruchowy ..................... 33/733 |
| 5,352,984 A | 10/1994 | Piesinger ..................... 324/532 |
| 5,514,965 A | 5/1996 | Westwood .................... 324/533 |
| 5,778,016 A | 7/1998 | Sucha et al. ................ 372/38.1 |
| 6,097,755 A * | 8/2000 | Guenther et al. ............ 375/228 |
| 6,418,162 B1 * | 7/2002 | Yau et al. .................... 375/224 |

* cited by examiner

Primary Examiner—Michael Nghiem
(74) Attorney, Agent, or Firm—Andrews Kurth LLP

(57) ABSTRACT

A circuit for determining an indication of a length of a conductor. The circuit includes a terminal for connection to a conductor under test such as a cable. A pulse source is coupled to a sample-hold latch and a re-synchronizer, and the pulse source provides a signal to the terminal for testing the conductor. A voltage comparator is coupled to the terminal for providing a signal to the pulse source and the terminal. The circuit also includes a length error detector coupled to the sample-hold latch, the re-synchronizer, and the pulse source.

15 Claims, 11 Drawing Sheets

METHOD AND APPARATUS FOR MEASUREMENT OF LENGTH OF CABLE HAVING FIXED IMPEDANCE

REFERENCE TO RELATED APPLICATIONS

The present application is a continuation-in-part of U.S. provisional application of Andrew Smith, Serial No. 60/215,755, entitled "Method and Apparatus for Measurement of Length of Cable Having Fixed Impedance," and filed Jun. 30, 2000, which is incorporated herein by reference as if fully set forth.

The present application is related to U.S. provisional application of Andrew Smith, entitled "Method and Apparatus for Measurement of Length of Cable Having Fixed Impedance," and filed Sep. 6, 2000, which is incorporated herein by reference as if fully set forth.

TECHNICAL FIELD

The invention relates to the measuring of the length of a signal propagation path. More particularly, the invention relates time domain reflectometry measurements of the length of a signal propagation path having a fixed impedance.

BACKGROUND ART

Time domain reflectometry (TDR) is a method of determining cable length and is analogous to determining distance in radar applications. TDR is based on the principal that a wave front traveling along a fixed impedance will be reflected by a gross impedance mis-match. The amount of the reflected energy with respect to the impedance mismatch is beyond the scope of this mention. Also, for a wave to travel, there must be a fixed impedance or only gradual changes in impedance along the path of propagation as well as minimal resistive losses. The impedance of a transmission path is dependent upon the capacitance and inductance per distance of the transmission line. The exact relationship is beyond the scope of this mention.

TDR can be measured by a high frequency counter which counts the amount of time that passes between sending a signal down a transmission line and receiving the reflection. To measure with a resolution of 1 foot down a cable where the propagation of the signal is 1.5 ns (nanoseconds) per foot requires a very high frequency counter (333 MHZ is a likely candidate frequency). To measure using this method over long distances, the counter itself must be very large. Because of the large size and speed of the counter, this can be a very power consuming solution, but is not uncommon.

TDR can also be measured by turning the transmission line into a tuned element in an oscillator. The longer the cable, the lower the frequency, much like a tuning fork. The problems with this method are numerous. The oscillator must be able to run at a very wide bandwidth, determined only by the transmission cable length, this could result in a very difficult to design oscillator. Also, to convert the rate of frequency to distance would require substantial processing power.

SUMMARY OF INVENTION

A circuit consistent with the present invention is used for determining an indication of a length of a conductor. The circuit includes a terminal for connection to a conductor under test. A pulse source circuit is coupled to the terminal for providing a signal to the conductor for use in determining an indication of the length of the conductor. A frequency generator circuit, coupled to the pulse source circuit, produces first and second frequency signals having a particular relationship. A mixer, coupled to the frequency generator circuit and the pulse source circuit, receives signals related to the first and second frequency signals and mixes the received signals to produce an output signal.

BRIEF DESCRIPTION OF DRAWINGS

The accompanying drawings are incorporated in and constitute a part of this specification and, together with the description, explain the advantages and principles of the invention. In the drawings.

FIGS. 4A, 4B and 4C are a schematic diagram of a second circuit according to the invention;

FIGS. 5A and 5B are a schematic diagram of a third circuit according to the invention;

FIGS. 6A and 6B are a schematic diagram of a fourth circuit according to the invention.

DETAILED DESCRIPTION

I. Introduction

Figure 1:
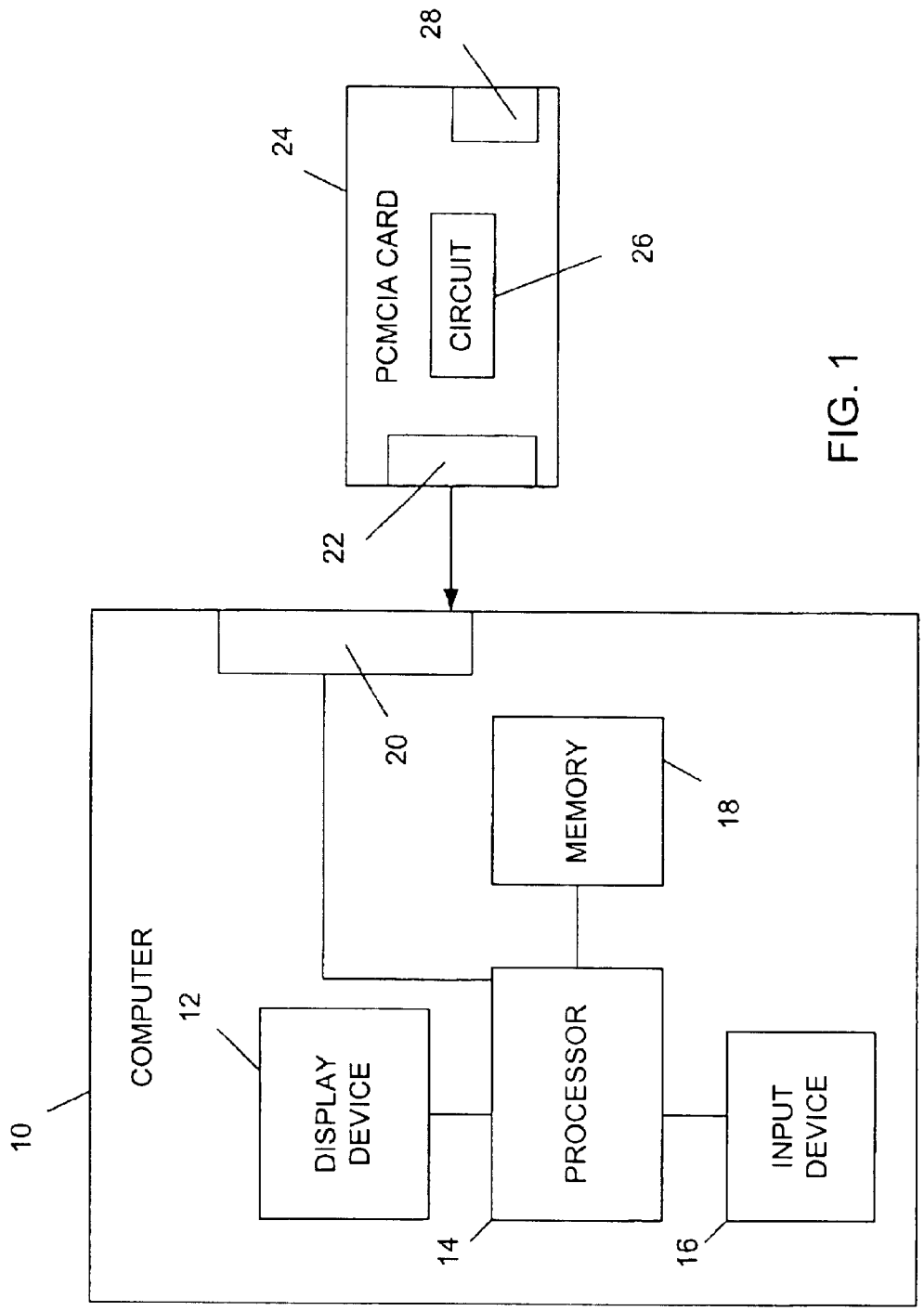
FIG. 1 is a block diagram of a system incorporating a circuit for measuring a cable length or performing other functions according to certain embodiments of the invention.

In comparison to the known prior art, certain embodiments of the invention are capable of achieving certain advantages, including the following:

1. The circuit can be built inexpensively (e.g, about $10 or less in volume) because it requires only a small number of inexpensive components.

2. Distance accuracy is not subject to a tolerance or percentage of distance. For example, if it can measure to 1 foot of resolution at 10 feet, it can still measure to 1 foot of resolution at 2000 feet, not 10% at 10 feet and 10% at 2000 feet.

3. The same technology and circuit can be used for non-copper medium such as space and fiber with any passive reflector. For example, a strobe light triggered by an "outgoing pulse" and a phototransistor to trip the comparator circuit, both pointing toward a wall, will give the distance to the wall. A high-brightness LED could be used, or a laser. The distance to the moon could be measured with the right frequencies, as long as the frequencies are selected properly and held tight, the necessary stipulations.

4. The same technology and circuit can also be used with active reflectors in place, such as repeaters and beacons that might receive a radio signal and send one back This would make for an excellent way of finding a car in a parking lot or finding a soldier in the field, for example. Soldiers in the field now transmit a signal all the time. Only the government is supposed to know the frequency. The problem is that the frequency could be scanned for using a conventional scanner. With an active reflector, the transmission is only made when if the right signal is first received. Current Global Positioning System (GPS) devices work up to 3 feet. A user could know within one foot with the present circuit (or better or worse, depending on how the frequencies are set). With a directional antenna, the first inexpensive direction-and-distance handheld device could be made for the general public to, for example, find their children or alarm the parent if they go a certain distance- plus be able to continue to track the child outside of a pre-programmed radius. It might even be possible to have three units in a triangle configuration whose data could be used to calculate both distance and direction without a directional antenna.

5. In one embodiment, where an average is taken over several measurements using a phase-locked loop (PLL), improved distance resolution is possible. In fact, distance resolution and speed of measurement can be traded off by taking more or less repeated measurements.

Those skilled in the art will appreciate these and other advantages and benefits of various embodiments of the present invention upon reading detailed description with reference to the below-listed drawings.

II. Overview and Mathematical Preliminaries

The invention is capable of measuring a length of cable to a preset resolution (such as 1 foot) up to a certain length of cable (such as 1400 ft) and provide an indication if the cable is longer than the predetermined circuit settings. The maximum length of the cable and ta resolution to which the cable is measured are both determined by two frequencies, Fa and Fb, and is fully adjustable and/or programmable.

With the propagation velocity of a signal along a cable known to be Vp, the round-trip time (T) can be calculated as:

$$T = \frac{2 \times Length}{Vp}$$

The time resolution (t) of measurement using the circuits presented is determined by:

$$t = \left| \frac{1}{Fa} - \frac{1}{Fb} \right|,$$

where Fa and Fb are close in value. Or, when the propagation velocity is also used, the resolution in distance (d) is determined by:

$$d = \frac{Vp \times \left| \frac{1}{Fa} - \frac{1}{Fb} \right|}{2}$$

The maximum length (Lmax) of cable that can be measured at maximum rate without error, with Fa <Fb is:

$$Lmax = \left( \frac{1}{Fa} + \left| \frac{1}{Fa} - \frac{1}{Fb} \right| \right) \times \frac{d}{2} = Nx \frac{d}{2}$$

The quantity in brackets in the above equation is also the number of samples (N) and TDR pulses (N) that are needed to complete a single measurement. The maximum rate by which complete measurements can be made is then:

$$Nx \frac{1}{Fa}$$

if samples are taken in sync with Fa. Samples can also be taken in sync with Fb. The maximum length (Lmax) of cable that can be measured at half rate (using Embodiment 4) without error when Fa <Fb is: Lmax=N d.

Presented below are four embodiments of a cable length measurement apparatus. Embodiment 1 is described below with reference to a block diagram (FIGS. 2A–2B) and a circuit schematic (FIGS. 3A–3C). Embodiments 2–4 are described below with reference to circuit diagrams (FIGS. 4A–6C). A cable length measurement method is described below with reference to a flow chart (FIG. 7). Finally, a suitable for use with the cable length measurement invention, is described in greater detail.

FIG. 1 illustrates use of the circuits for various embodiments within a computer 10 configured to perform diagnostics or other functions. Computer 10 includes a display device 12, a processor 14, an input device 16, and a memory 18. Processor 14 can access programs stored in memory 18, for example, for execution. Computer 10 can also include a connector 20 for receiving a Personal Computer Memory Card International Association (PCMCIA) card 24, which has a corresponding connector 22. Connectors 20 and 22 provide for electronic communication between computer 10 and PCMCIA card 24, as is known in the art. PCMCIA card 22, in this example, can be configured to include a circuit 26 for measuring a length of cable or performing other functions as described in the present specification. Circuit 26 can be implemented with the circuits for the various embodiments discussed below. A connector 28 in PCMCIA card 24 can be configured to connect with a cable, for example, in order to measure a length of it using circuit 26. Connector 28 can alternatively be configured to connect with other conductors for measuring their lengths or performing other functions as described in the present specification.

Computer 10 may be implemented with, for example, a laptop or notebook computer for portability in measuring lengths of cables or performing other functions at various geographic locations. Processor 14 can be programmed to receive an indication of a cable length from circuit 26 via connector 20, using the circuits as discussed below, and display an indication of the length on display device 12. Processor 14 can also be programmed to perform various other functions using circuit 26 as described in the present specification. Accordingly, circuit 26 on PCMCIA card #22 can be used to configure computer 10 as a diagnostic tool.

PCMCIA card 22 is provided for illustrative purposes only as a possible use and implementation of circuit 26. It provides a convenient way to use the circuit in that many computers have compatibility with PCMCIA cards. Alternatively, circuit 26 can be implemented directly within a computer or other processor-based device, which can include a connector for connecting a cable or other conductor to the circuit.

One benefit of the circuits discussed is that they allow for a very accurate measurement of a pulse width of a constant frequency, over a very large dynamic range (correlating time and distance, for example, using the same instrument to measure 10 ns (or 10 feet) with 1 ns (or 1 foot) of accuracy and measuring 1000 ns (or feet) with 1 ns (or foot) accuracy for example), at a lower cost than current methods. The uses include, for example, anytime an electrical response is received after a wave front generated from an electrical stimulus travels through a medium of an unknown length (or distance). This includes radar, laser ranging, ultra-sound, cable-length measurement (as in the application of this device), fluid level measurements, sonar, monitoring the presence of bodies within a radius, and other applications.

The product implementing the circuit can be made very small, consume only a small amount of power, and be affordable. The circuit can be implemented in a space no larger than a penny, for example.

III. Embodiment 1

Overview of Circuit Components (FIGS. 3A–3C)

F1 & F3 Generator: A programmable interrupt controller (PIC) microcontroller is programmed to produce two frequencies, which can be called F1 and F3. F1 is passed along directly as Fa, in this case, correlating to FIGS. 2A and 2B. F3, however, is produced by dividing F1 down by a factor, N2 where N2 is an integer. This new frequency, F3, enters into the PLL circuit which is wired as a frequency multiplier. Frequency F1 is derived from the 20 MHz input clock by dividing it by a relatively large number and multiplying that by a smaller number, resulting in F1=x1/x2 * 20 Mhz.

PLL Frequency Multiplier & Divide by N1: The PLL is used to "multiply-up" the incoming F3 frequency by the value "N1" to produce F2, called Fb in FIGS. 2A and 2B. The result is that F2 is exactly equal to F3 * N1 in the average, but includes a factor of error on a cycle-by-cycle basis, called "jitter." Both characteristics of F2, namely exact average and jitter, are key factors in achieving accurate measurement results.

Sample-Hold Latch (Mixer): This device is key to the theory of operation of this circuit, and is a unique application for a FlipFlop. This device is referred to in FIGS. 2A and 2B, but may be better explained as a signal mixer, rather than as a "Sample-Hold Latch." It may also be explained as a pulse-width multiplier. The Flip-Flop is receiving two signals very close in frequency (separated in frequency by only a few Hertz—a tiny percentage) but very different in pulse width. The signal with the narrower pulse width is entering into the "D" input and the signal with 50 percent duty cycle is entering into the "CLK" input. The result at the output "Q" is a frequency equal to the "beat frequency" or frequency difference between the two incoming signals—this is similar to the effect a mixer would have. The output pulse width, however, is the product of the smaller pulse width multiplied up by the factor of the longer incoming cycle time divided by the differences in periods between the two incoming signals. For this reason, the Flip-Flop has the effect of multiplying the incoming pulse width up in width, to a more readable duration, where a high-speed counter would not be necessary.

Circuit Components and Operation

Figure 2A:
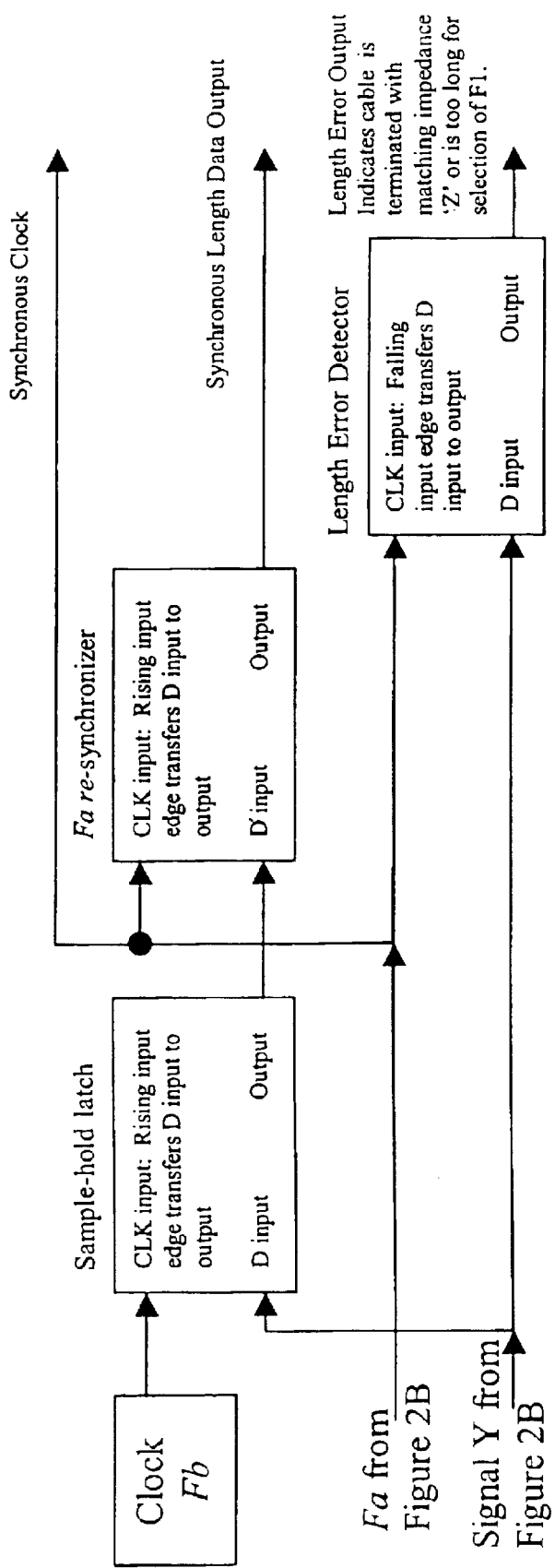
FIGS. 2A and 2B are a block diagram of a system for measuring a cable length according to one embodiment of the invention.
Figure 2B:
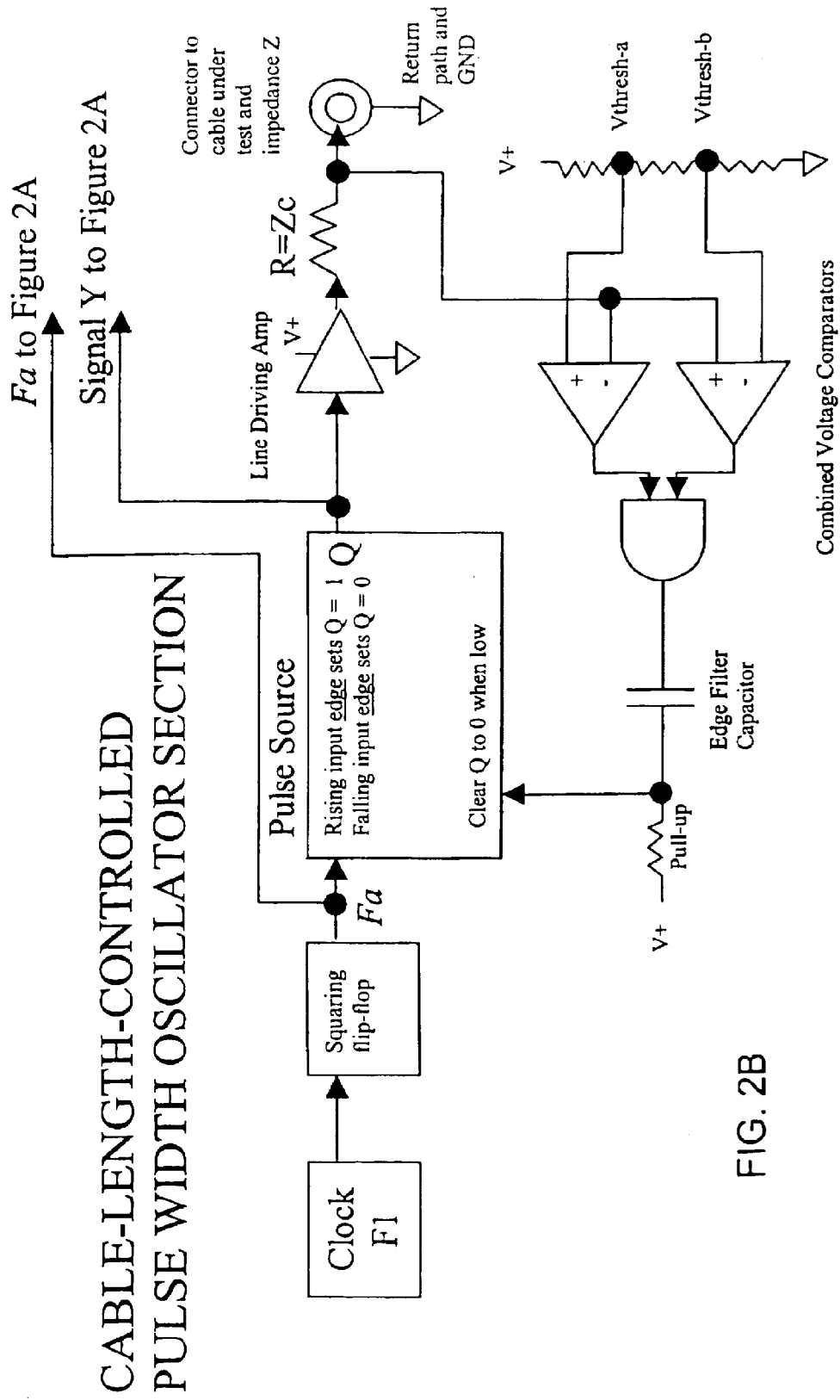
Figure 3A:
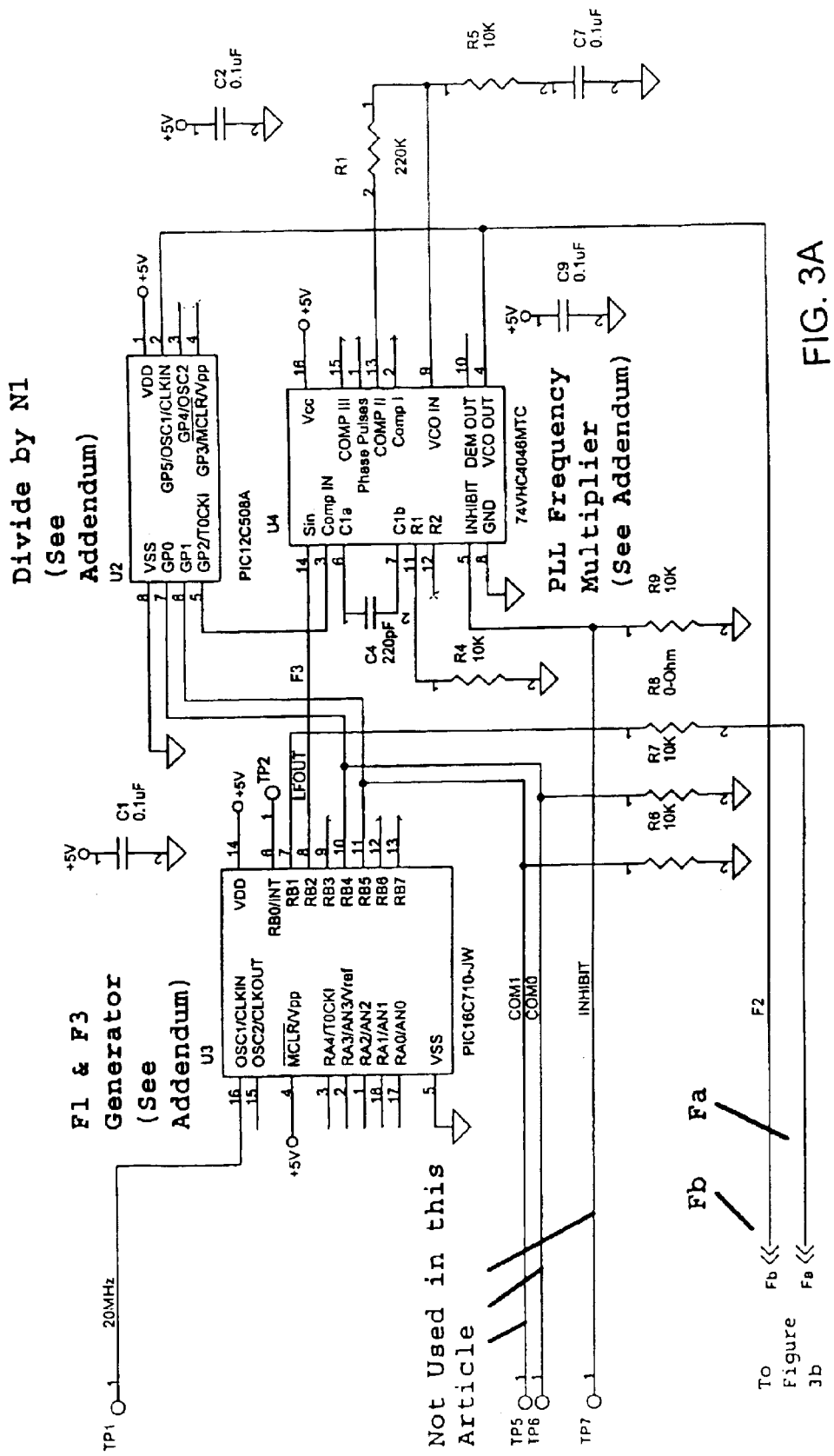
FIGS. 3A, 3B and 3C are a schematic diagram of a first circuit according to the invention.
Figure 3B:
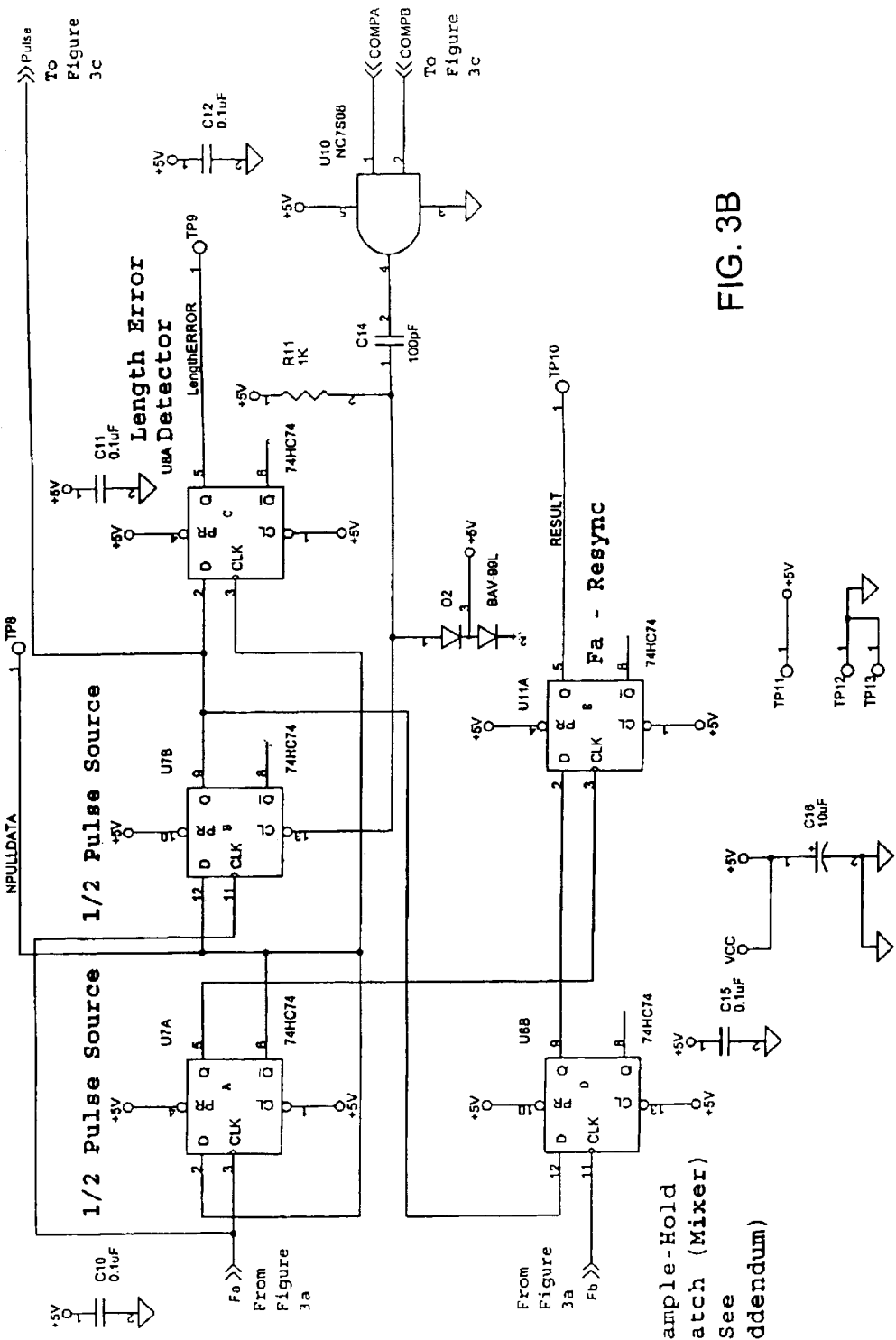
Figure 3C:
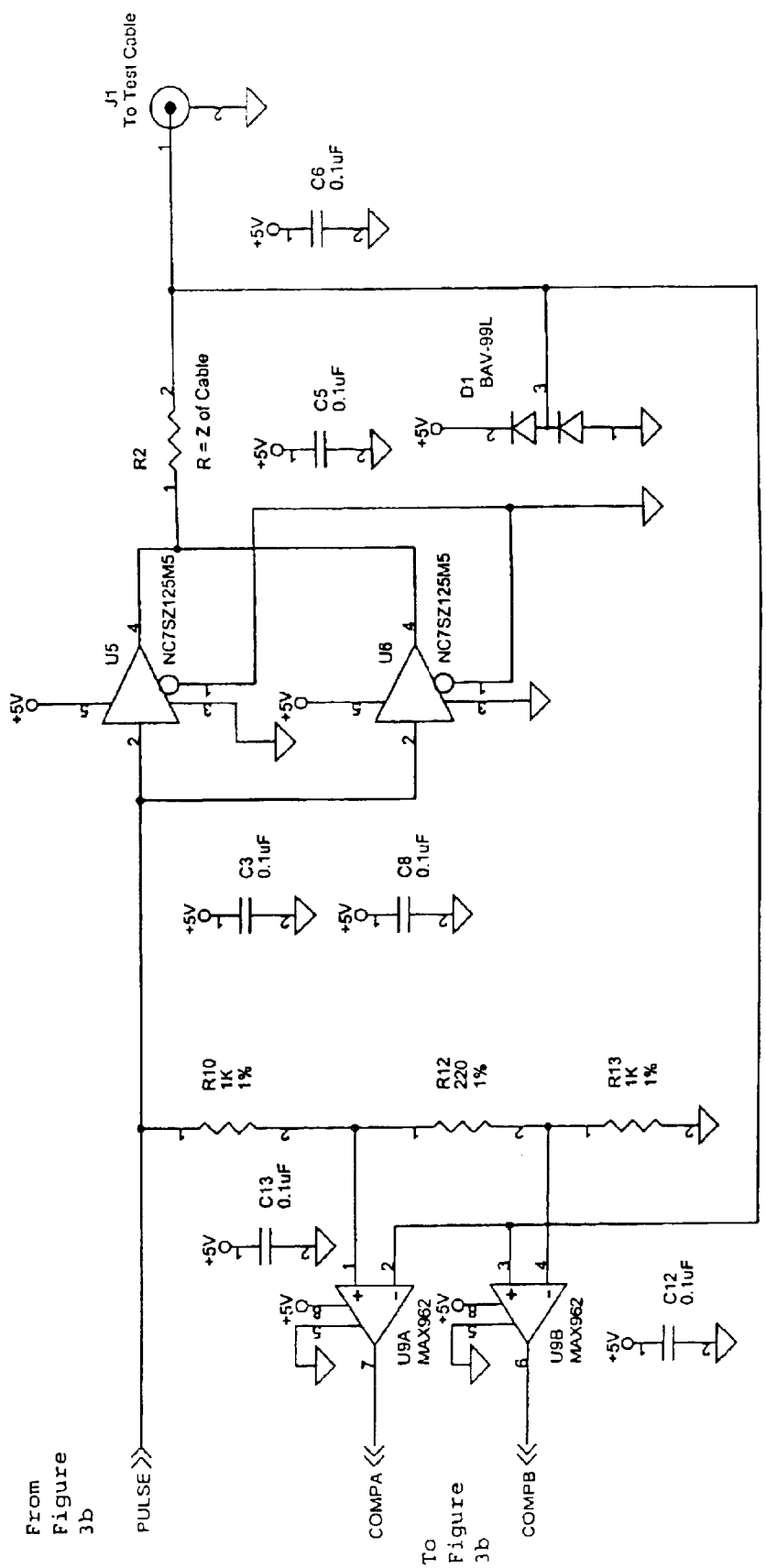

FIGS. 2A and 2B are a block diagram of a system for measuring a cable length, according to Embodiment 1 of the cable length measurement invention. The system is composed of two major sections, the cable-length-controlled pulse width oscillator section and the pulse width testing and data output section, as shown in FIGS. 2A and 2B. FIGS. 3A–3C are a schematic diagram of a corresponding circuit.

Devices U2, U3, and U4 generate two frequencies, F1 and F2, which are phase locked. These frequencies are in phase every N cycles (per the formulas above where F1=2 Fa and F2=Fb). The actual frequencies used are selected by knowing the needed resolution (d), the approximate signal propagation velocity (Vp) and the maximum length of cable that must return a valid measurement (Lmax) (and not just an "over-length" error).

For the circuits of Embodiments 1–4, F1=454545 Hz and F2=27582 Hz (all frequencies are rounded to the nearest unit). These frequencies are generated as follows: The PIC 16C710 device (U3) generates two frequencies from a 20 MHz fixed input frequency. The generated frequencies are 454545 Hz (20 MHZ divided by 44) and 618 Hz (further division by 735). The 618 Hz frequency is fed into a 4048 type PLL phase comparator input. The other phase comparator input of the 4048 type PLL is driven by a PIC12C508 (U2) programmed as a divide-by-368 counter. The relevant input of the PIC12C508 (U2) is the output frequency of the PLL. The circuit of the PIC12C508 and 4048 type PLL is therefore, effectively, a frequency multiplier (or frequency synthesizer), where the output frequency of the PLL is $$20000000 \times \frac{368}{44 \times 735} \approx 227582 Hz.$$

This is effectively Fb from the discussion above

Before the 454545 Hz signal is used as a reference from which samples are taken, it is made square with the use of a 74LS74 type flip-flop (U7A) so that the duration of a "1" is the same as its duration of a "0" (square). This bring the effective frequency of Fa down to 227272 Hz. According to the formulas presented above, this will result in a resolution of 6 ns, or 2 feet, for cable measurements, given that the signal propagates at 1 foot /1.5 ns in the category 5 cable tested.

These frequencies are used in all of the attached schematics for Embodiments 1–4, but can be changed to suite any resolution and length of cable. Without changing the frequencies, the length measurement can also be scaled to accommodate different Vp values.

The flip flop U7A, as mentioned above, squares the incoming clock and divides the incoming frequency by two. With every other rising edge of the F1 clock, then, the Q output of U7B will drive a signal onto the wire at J1. This is done with some buffering by U5 and U6, which assure that there is appropriate signal strength without compromising rise and fall times, i.e. speed. R2, between the driver outputs and the wire is set to equal the cable impedance (e.g.,100 ohms with 100 ohm (category 5) twisted pair cable). Because the cable has an impedance that matches R2 by design, the voltage measured at J1, immediately when the signal is applied there, will be held at one-half of the supply voltage. This voltage will then propagate down the wire until an impedance mismatch suitable to reflect detectable energy levels, interferes with the propagation. For example, for cable in good condition and with a fixed impedance (relatively "lossless"), such as cable used for communication, an open circuit or short circuit at the end of the wire will reflect the signal. If an open circuit is encountered, then the returning voltage (still one-half the supply voltage) will be added to the transmitted voltage on the return path, resulting in a voltage equal to the supply voltage being detected by the comparators U9A and U9B. If a short circuit is encountered, then the returning voltage will be subtracted from the transmitted voltage, resulting in 0V being detected by U9A and U9B. The comparators will generate a low-going pulse when either extreme is detected.

The comparators U9A and U9B are wired together with an AND gate (in this circuit) so that the output of the AND gate will drop LOW and clear the Q output of U7B, effectively terminating the "pulse" down the cable. U9A and U9B are set with resistors whose values determine the voltage limits that will constitute a returning pulse. The resistors are 1 KΩ, 1% and 220Ω, 1%. The value of the 220Ω resistor can be increased to allow the circuit to better tolerate resistive (lossy) conductors; for example, it can have a value of 1000Ω. This results in any incoming voltages either above 11% of ½ of the supply voltage or below 11% ½ of the supply voltage generating a valid return detection in the form of a low-going pulse at the output of U10. The capacitor, C14, is used to assure that only the falling edge of the output of U10, the AND gate, is detected by U7B to clear it. Otherwise, the logic low state for U10 would hold U7B in a cleared condition. Because C14 holds a charge when the rising edge passes, the voltage can get dangerously high for sensitive logic, so diode D2 is used to limit the voltage peaks to a safe level, effectively "clamping" the high-side pulses.

Whether or not a valid return pulse has cleared U7B by the time the next F1 rising edge occurs, this next rising edge of F1 will clear U7B's Q output by shifting a 0 from the D input out to Q. This assures that U7B will always be ready to send a pulse and that all pulses will be limited in length if there is not an impedance mismatch suitable to return a pulse. Therefore, in the case where the line is terminated with an impedance that matches the impedance of the cable (in this case, 100 Ω) or if the cable is very long, U7B will still be cleared by the next rising edge of F1. This will occur when a reflection is not detected in the time of a full cycle of F1.

In the case where a matched load or a very long cable is used, no reflecion will be returned or detected before the second rising edge of F1. In this case, the driving output still held at the Q output of U7B will be shifted into and through USA at the same time that a new 0 is shifted into U7B. The Q output of U8A, signal "LengthERROR" is then used to signal a connected peripheral or to turn on an LED, indicating the condition.

In conclusion, the rising edge of F1 triggers a pulse down the wire whose width is determined by the length of the cable (T), or if there is not a suitable reflection, is limited to a width of the period of F1.

F2, whose phase on a cycle-by-cycle basis moves farther away from the phase of F1 and then returns in phase again (every 735 pulses for these particular frequencies) is used to sample the width of the Q output of U7B by shifting the value into another flip-flop, U8B, on every rising edge of F2. The result at the Q output of U8B is then shifted into U11A, back in phase again with F1, in order that results will not overlap transmissions and so that F1 is used for a minimal of purposes and its traces may be kept short. The Q output of U11A, therefore, is the "RESULT" which is to be shifted into a peripheral device, such as a processor on every edge of U7A ("NPULLDATA" available at U7A Not-Q-Output, has been selected for minimum signal loading, again to maintain edge speed and to minimize propagation delays of the circuit).

The data at "RESULT" appears as a pulse with a fixed frequency, but whose width varies with cable length (the frequency is F1/2 divided by 735). Its length can be measured by taking samples of the "RESULT" signal in phase with "NPULLDATA" which is also at a frequency of F1/2, as has been done during testing. The pulses can also be used to drive a low-pass filter where the analog output voltage would be proportional to the cable length.

IV. Embodiment 2

Figure 4A:
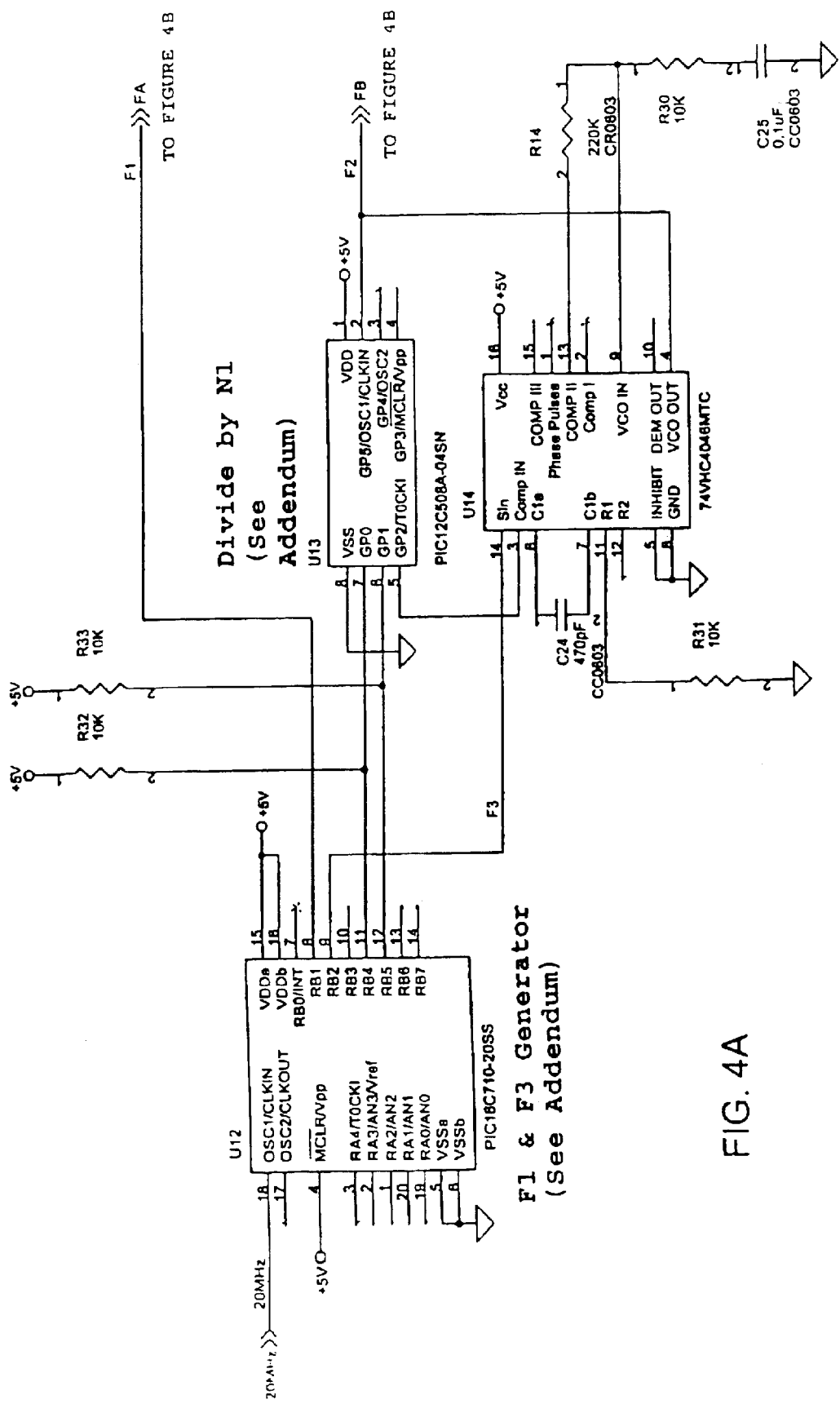
Figure 4B:
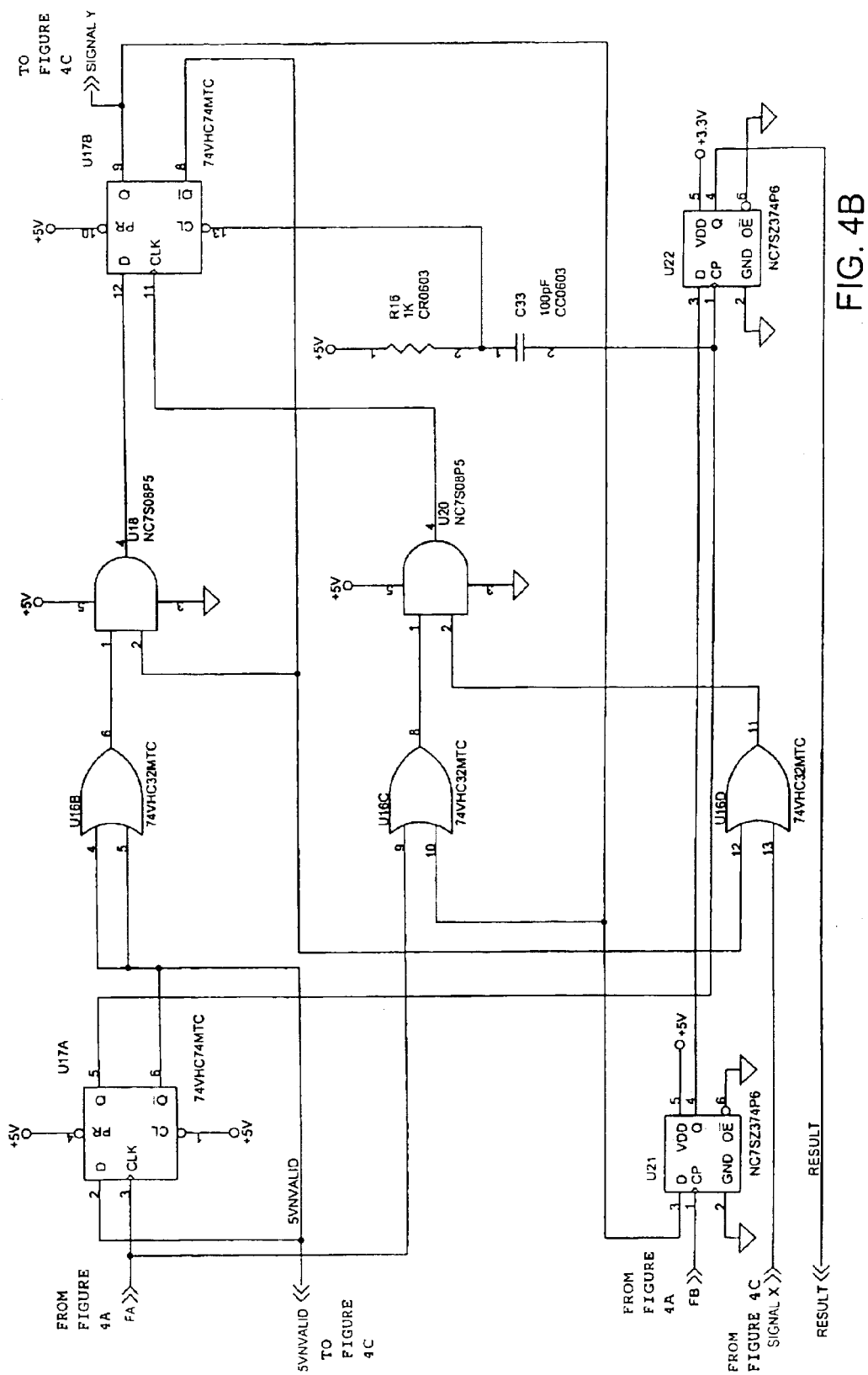

FIGS. 4A–4C are schematic diagram of a second circuit (Embodiment 2) according to the invention. This circuit and the general operation of this circuit are very similar to Embodiment 1 with the exception that the performance has been improved for shorter cable lengths. With shorter cable lengths applied using the Embodiment 1 circuit, C14 never obtains a charge heavy enough to result in a pulse suitable to clear the U7B flip-flop. That is, when the output of U10 is low for the great majority of the cycle time (short cables), and when it goes high only briefly and then low again, the low-going pulse is too small to be detected by U7B and the circuit does not function properly.

A digital solution, or steering logic, was then implemented for these short cable lengths (e.g., 20 feet). This circuit is comprised of U18, U20, U16C, and U16D. The polarity of the signal output from the comparator's gate was also changed. Also, to balance propagation delays that might be caused by U16C or U16D, U16A is added.

In embodiment 1, C14 operates properly at the default (no termination) long pulse-width. C33, which replaces C14 in embodiment 2, is still used for this purpose—to make sure that U17B is cleared in time for the next pulse, regardless of cable condition. The function to CLEAR U17B when a reflection has been detected has been moved from the CLEAR input of U17B to logic on the D and CLK inputs of U17B so that U17B will be set and cleared by the steering logic as needed. Essentially, these gates allow U17B to be set (Q output goes to a "1") on the rising edge of the CLK input ONLY when the Q output of U17B is a Zero, i.e., when the cable is NOT driven, (function of U18) AND on every-other-pulse of F1 (still the function of U17A, but with the added gate delay of U16A) -this is the only case when the D input is set to a "1". Otherwise, the D input is a Zero, so a CLK input would effectively CLEAR the flip-flop. The CLK input is steered by U16C, U16D and U20. A rising edge of CLK is allowed when the comparators detect a return pulse AND U17B is driving the cable (functions of U16C pin 10 and U20 and U16D pin 13) OR when there is not a driving of the cable AND a new F1 commands that a pulse be started. Any delay in the CLK signal to U17B caused by U20 and U16C and U16D is theoretically matched by the delays (added) in the D input of U17B caused by U18 and U16B.

V. Embodiment 3

Figure 5A:
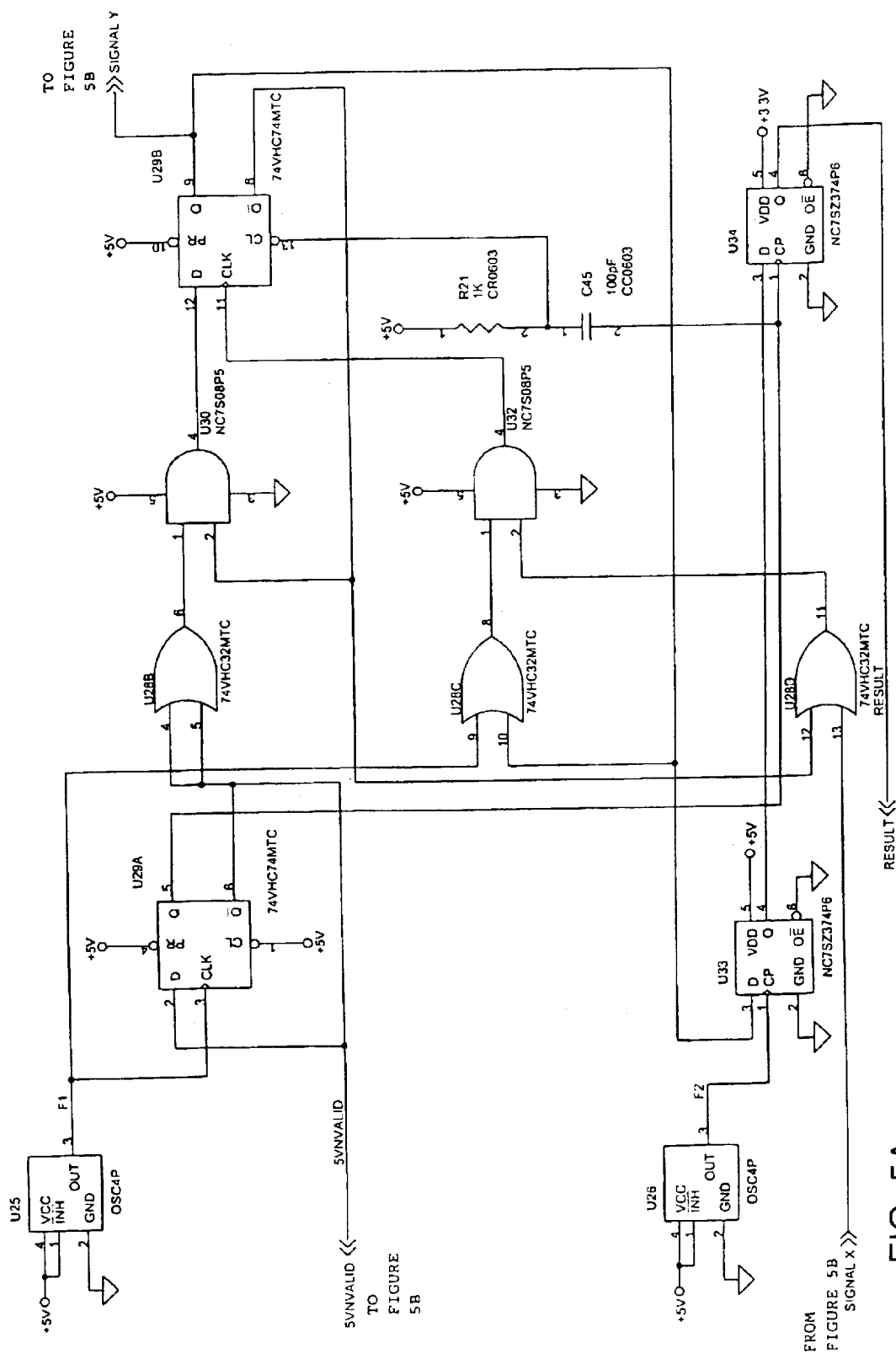

FIGS. 5A and 5B are schematic diagram of a third circuit (embodiment 3) according to the invention. Any "phantom" triggers caused by jitter in the phase-locked-loop circuit can be eliminated by replacing the PLL with two asynchronous crystal controlled oscillators. The problem with the PLL, as with any PLL, is slight jitter in the frequencies. A processor can easily correct the problem by taking many samples and averaging the results, especially after eliminating results that are more than a standard deviation away from the normal. But another method is used in this circuit, where two separate crystals are used.

VI. Embodiment 4

Figure 6A:
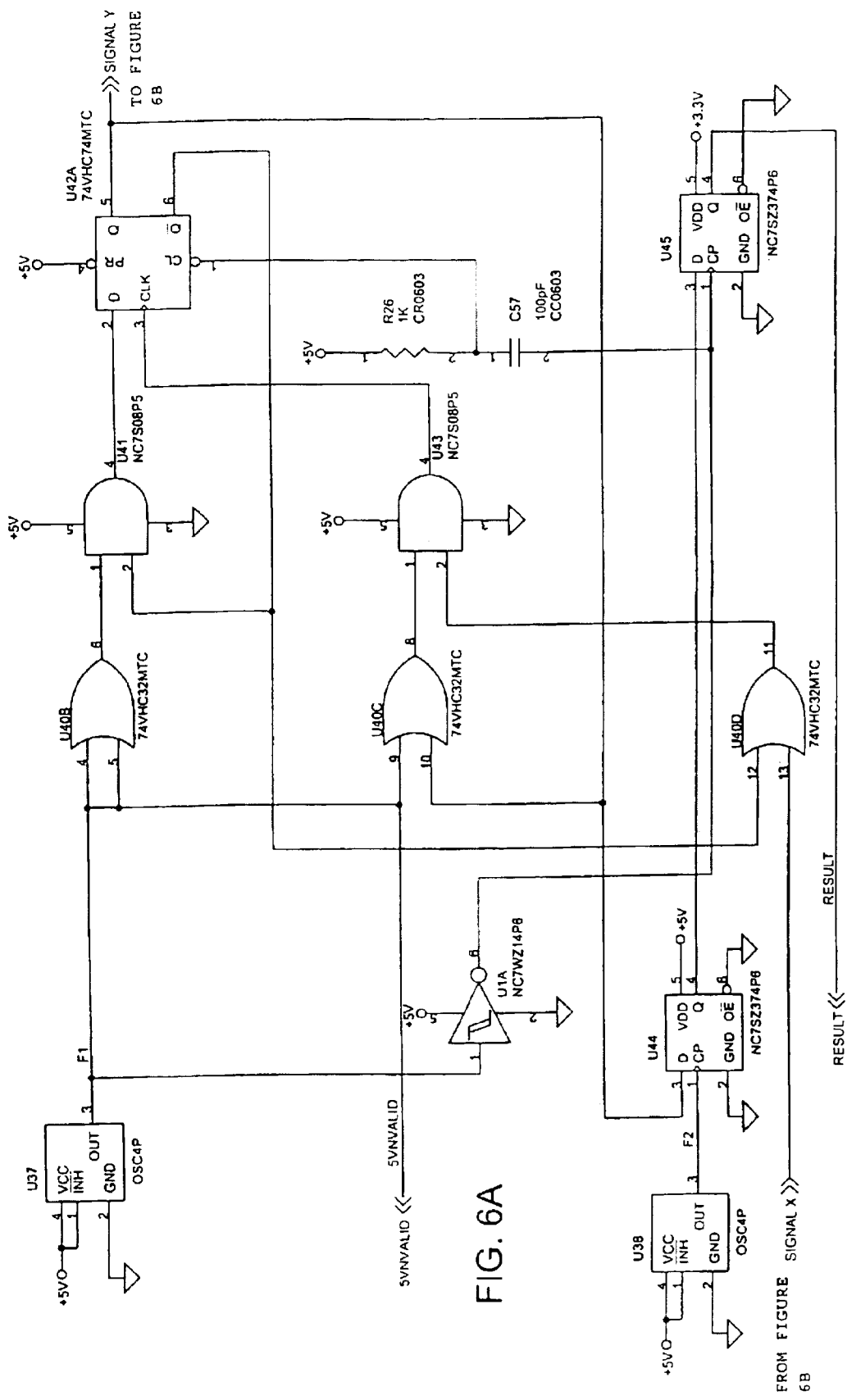
Figure 7:
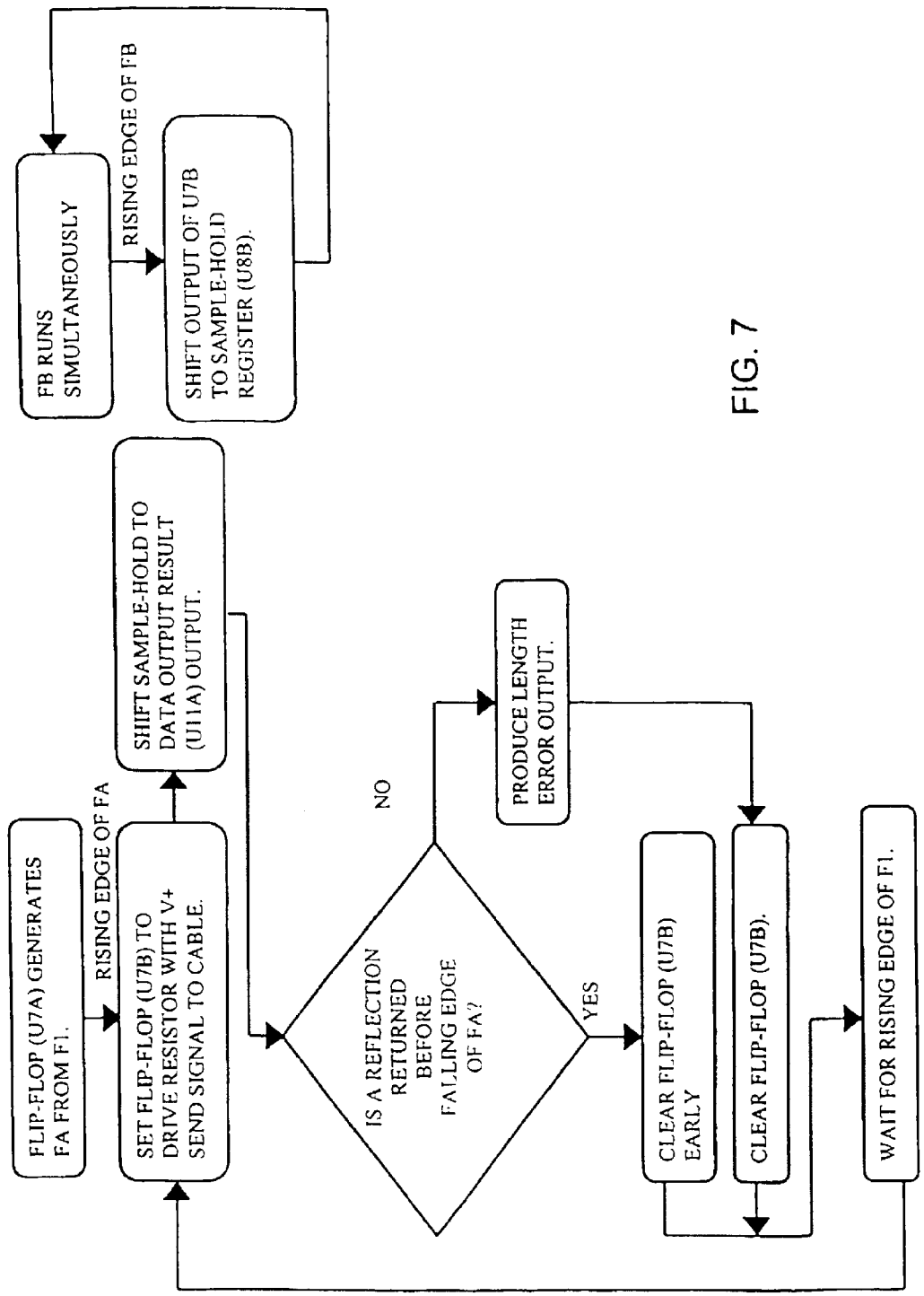
FIG. 7 is a flow chart of a method according to the invention.

FIGS. 6A and 6B are schematic diagram of a fourth circuit (Embodiment 4) according to the invention. Embodiment 4 differs from the previous embodiments in that the Length Error indicator has been removed, as well as the initial divide-by-two flip-flop that squares the pulse. As a result, this circuit allows for 1 foot resolution, or 3 ns, using the same F1 and F2 frequencies as before. No length error is provided, so cables must be limited in length or the late return pulses can cause false readings. This circuit provides excellent results for cables known to be no longer than a certain maximum length.

VII. Measurement Process

FIG. 7 is a flow chart of a method according to the invention. The following is a detailed explanation of the two concurrent processes depicted in FIGS. 6A and 6B. Parenthetical references are made to the elements of the Embodiment 1 circuit (FIGS. 3A–3C).

Cable-length-controlled Pulse Width Oscillator Section:

1. This section is excited by a reference oscillator, F1, (U3) which is "squared" by a flip-flop (U7A) so that the duty cycle of the signal is 50%. The frequency and signal is called "Fa".

2. Fa, is connected to a flip-flop (U7B) which is used to deliver a signal to the cable. The signal to the cable is turned "on" on the rising edge of Fa and turned "off" on the falling edge of Fa. It is important to note that when a "properly"

terminated cable of "suitable" length is connected, the return pulse from the cable will turn off the flip-flop (U7B) output before the falling edge of Fa does. This is because a cable "properly" terminated will return a signal detectable by the comparators (U9A,B) and a "suitable" length will assure that the returned signal will arrive before the falling edge of Fa. A properly terminated cable, for example, has an open or a short at the far end, but does NOT have a resistor across the end, especially not a resistor whose value is the same as the impedance of the cable.

3. The signal for the cable from the flip-flop (U7B) is amplified using a Line Driver Amp (U5 and U6) to isolate the cable "load" from the oscillator logic and to lift the voltage up to the level of the power supply rail. The signal is then fed through a resistor whose value is chosen to match the impedance of the cable, so that the resistor and the cable form a voltage divider network whose tap is fed to the comparator.

4. When the signal is initially applied to the cable, the resulting voltage measured at the cable and after the resistor is ½ the driving voltage, until the time when the signal propagates all the way down the cable and has returned. (Knowing the speed of propagation of a signal down the cable, this time period can be used to measure the length of the cable. This method of measurement is called Time Domain Reflectometry.) From Electromagnetic Wave Theory, and Wave Theory in general, when the signal hits a gross impedance mis match, such as an open circuit or short circuit, the energy of the propagated signal will be reflected back to the source. If an open circuit is encountered, the returning signal will reinforce the incoming signal and its amplitude will be doubled. If a short circuit is encountered, the returning signal will cancel the incoming signal and its amplitude will be zero. This new voltage will appear back at the inputs of the comparators at the time of the round-trip of the signal originally applied.

5. Before the signal is applied to the cable, the comparator input will sense 0V. A voltage of 0V is outside of the range of Vthresh-a and Vthresh-b (actually less in potential than Vthresh-b) and so the output of the AND gate will be 0V. This 0V will be blocked by the capacitor allowing the pulse to be started and the flip-flop (U7B) to be set. When the signal is applied to the cable, the voltage at the input of the comparator from the cable will fall between the voltages set by the resistors (Vthresh-a and Vthresh-b) and the output of the AND gate will be the supply voltage. As soon as the signs reflected from the far end of the cable arrives, the voltage a applied to the comparators will either jump above Vthresh-a (an open was encountered) or fall below Vthresh-b (a short was encountered). This even will again drop the output of the AND gate to 0V. Because the speed of the signal propagation along the cable is very fast, this must occur (and will occur if the cable is short enough, or of "suitable" length) before the flip-flop (U7B) is forced to turn off by the falling edge of Fa.

6. The drop to 0V at the output of the AND gate will pass a low-going edge through the capacitor and to the flip-flop (U7B), turning off the cable drivers.

7. If the flip-flop (U7B) was not already cleared by a returning signal on the cable, the falling edge of Fa will occur and the flip-flop will be forced to be cleared this way.

8. The rising edge of Fa will occur again bringing the loop back to item (2) in this list.

Pulse Width Testing and Data Output Section:

1. On the rising edge of Clock Fb, the current value of Q, driving the cable, is shifted to the output of a Sample-hold latch (U8B).

2. On the rising edge of Clock Fa, the current value shifted to the output of the Sample-hold latch (U8B) is sent out as RAWDATA OUT for use. (In sync with the Synchronous Clock output, or Fa).

3. On the falling edge of Fa, the current value of Q, driving the cable, is shifted to a Length Error output. That is, if Q was not a 0 by the time of the falling edge of Fa, a return pulse was not detected in time for a length measurement.

VIII. Phase Locked Loop

Driving the clock input of the PIC12C508 (or any other processor) with the output of the VCO of the PLL makes a very inexpensive and very powerful frequency synthesizer. Normally the divider circuits in such synthesizers are specialized for specific applications, operate at higher frequencies (only), have too many pins and are too large or consume more power, and certainly are more money.

The "RESULT" signal is read into a processor in sync with the "NPULLDATA" signal. If jitter is present, the least expensive solution is to filter the sporadic data after it is received. The filtering algorithm is to read the data many times over and produce a frequency table (Measurement X occurs Y times) which includes each data measurement. After this table of unique data values and their number of occurrences is constructed, all that needs to be done is to take the most frequent occurrence as these result, or, if there are two, take their average.

Fa and Fb must be asynchronous clocks and must be only nano-seconds apart in frequency, yet it is preferred that all of the clocks be somehow derived from a single fixed oscillator to lower cost, board space and power consumption. To minimize these factors, a unique application of a tiny microcontroller is used as a divide by N counter in a frequency synthesizer circuit to produce Fb. The clock input of the microcontroller is driven by the At Voltage Controlled Oscillator (VCO) output of a PLL device. The microcontroller runs application code at the free-running frequency of the VCO which produces pulses on an output at the rate of the VCO divided by N. The output pulses of the microcontroller provide the feedback signal to the PLL to close the signal path and achieve phase lock with Fa after every N×t seconds. The Parameter t is the difference in time between the phases of each clock, Fa and Fb.

Another microcontroller is used to generate two frequencies which are far enough apart that they may be derived directly from a single oscillator source. One of these frequencies is used as a reference frequency input to the frequency synthesizer (multiplier) loop. The other frequency is used directly as Fa.

It has been found that prime numbers, least common multiples, and greatest common factors are important in determining the values with which to program the microcontrollers, since they must be programmed with integer values.

IX. Output Interface

The circuits can transmit the length in an analog fashion. The pulse width is proportional to the length of cable, up to the maximum length, where the pulse width is 100%. A cable of 0 length would result in a 0% duty cycle pulse stream, or all 0's. A cable of ½ of full rated length would result in a 50% duty cycle pulse stream at the RESULT output. Only one output signal is used.

The pulse stream can also be interpreted digitally if a sample of the stream is taken on every cycle of the Fa clock (synchronous clock). There would be N samples before the data is repeated. The number of 1's in a row would represent the proportion of the cable length with respect to the maximum length, L. Also, each sample would have the resolution in length of d, from the formulas in this document. Two output signals are used. These are the RESULT output and the Synchronous Clock output (Pa).

Optionally, the distance resolution can be improved by repeated measurements. In Embodiments 1 and 2, in which a frequency multiplier outputs a signal having a frequency Fb. The equations in section II, above, assume that the frequencies Fa and Fb are deterministic. In reality, however, the frequency Fb is somewhat random. More specifically, the output of the frequency multiplier is a signal whose frequency is a Gaussian random variable with a mean of Fb. That is, the instantaneous frequency is Fb+/−Fj where Fj is frequency jitter. In the average, or measured over time, the frequency will be found to be Fb, nearly exactly, but when measured cycle-by-cycle, the frequency is some value close to but not exactly Fb. It is because of this jitter that two separate, independent, crystal-based oscillators may be desirable, as section V explains in relation to Embodiment 3, but there is also a benefit to the jitter. The disadvantage of the jitter is that the N samples taken any one time will not be accurate and that an average will have to be taken of numerous sample sets for an accurate reading to be achieved. Without the jitter, it would be possible to take N samples one time and achieve a result accurate to within the resolution calculated by the formulas. The advantage of the jitter is that with an average of many sets of N samples, the resolution turns out to be greater than that derived in the formulas. In fact, infinite resolution may be possible, provided a long enough running average, over a "long" time, is taken. In one experiment, for example, the formula yields a resolution of 3 feet, but the actual resolution with an average taken over 600 sets of N samples, yields an accurate resolution of 1 foot. Additional measurements in excess of 600 result in even more precision when distance resolution is a design goal. With the clock rates used in this experiment, approximately 0.5 seconds are required to acquire 600 sets of samples, but this delay is still imperceptible to the user.

A running average can be computed continuously. In a preferred form, a running sum of distance measurements is maintained along with a running count of the number of measurements. At any time, the instantaneous average is the running sum divided by the running count.

This phenomenon of improved resolution by averaging repeated measurements is well founded in statistical methods. Because the frequency Fb is well modeled as a Gaussian random variable, the distance measurement, which is derived from Fb, is also well modeled as a Gaussian random variable. An average of M independent Gaussian random variables is another Gaussian random variable with the same mean and a variance scaled by a factor 1/M. Thus, the average of many samples is more precise, even beyond the precision of any individual quantized, digital measurement.

The terms and descriptions used herein are set forth by way of illustration only and are not meant as limitations. Those skilled in the art will recognize that many variations are possible within the scope of the inventions and their equivalents.

What is claimed is:

1. A circuit for determining an indication of a length of a conductor, comprising:
    a terminal for connection to a conductor under test;
    a pulse source circuit coupled to the terminal for providing a signal to the conductor for use in determining an indication of the length of the conductor;
    a frequency generator circuit, coupled to the pulse source circuit, for producing first and second frequency signals having a particular relationship; and
    a mixer, coupled to the frequency generator circuit and the pulse source circuit, for receiving signals related to the first and second frequency signals and for mixing the received signals to produce an output signal.

2. The circuit of claim 1 wherein the frequency generator circuit comprises:
    a frequency generator producing the first frequency signal and a third frequency signal; and
    a multiplier circuit, coupled to the frequency generator, for receiving the third frequency signal and producing the second frequency signals, wherein the second frequency signal is a multiple of the first frequency signal.

3. The circuit of claim 2 wherein the multiplier circuit comprises:
    a phase-locked loop coupled to the frequency generator; and
    a divide by N circuit coupled to the phase-locked loop.

4. The circuit of claim 2 wherein the multiplier circuit comprises two asynchronous crystal controlled oscillators.

5. The circuit of claim 1 wherein the mixer comprises a sample-hold latch.

6. The circuit of claim 1 wherein the terminal is configured for connection to a cable.

7. The circuit of claim 1, further comprising a capacitor coupled between the terminal and the pulse source circuit.

8. The circuit of claim 1, further comprising steering logic coupled between the terminal and the pulse source circuit.

9. The circuit of claim 1, wherein the first frequency signal has a different frequency than the second frequency signal.

10. The circuit of claim 9, wherein the first frequency signal and the second frequency signal have independent and varying phases with respect to each other.

11. The circuit of claim 1, wherein the conductor completes the pulse source circuit when connected to the terminal.

12. A circuit for determining an indication of a length of a conductor, comprising:
    a terminal for connection to a conductor under test;
    a pulse source circuit coupled to the terminal for providing a signal to the conductor for use in determining an indication of the length of the conductor, wherein the pulse source circuit comprises a circuit for producing a signal having a fifty percent duty cycle of a received signal;
    a frequency generator circuit, coupled to the pulse source circuit, for producing first and second frequency signals having a particular relationship; and
    a mixer, coupled to the frequency generator circuit and the pulse source circuit, for receiving signals related to the first and second frequency signals and for mixing the received signals to produce an output signal.

13. A circuit for determining an indication of a length of a conductor, comprising:
    a terminal for connection to a conductor under test;
    a pulse source circuit coupled to the terminal for providing a signal to the conductor for use in determining an indication of the length of the conductor;
    a frequency generator circuit, coupled to the pulse source circuit, for producing first and second frequency signals having a particular relationship;
    a mixer, coupled to the frequency generator circuit and the pulse source circuit, for receiving signals related to the first and second frequency signals and for mixing the received signals to produce an output signal; and a length error detector circuit coupled to the pulse source circuit and the mixer.

14. A circuit for determining an indication of a length of a conductor, comprising:

- a terminal for connection to a conductor under test;
- a sample-hold latch;
- a re-synchronizer coupled to the sample-hold latch;
- a pulse source coupled to the sample-hold latch, the re-synchronizer, and the terminal;
- a voltage comparator coupled to the pulse source and the terminal; and
- a length error detector coupled to the sample-hold latch, the re-synchronizer, and the pulse source.

15. A method for determining an indication of a length of a conductor, comprising:

- generating first and second frequency signals having a particular relationship;
- mixing signals related to the first and second frequency signals to produce an output signal;
- applying a pulse edge, based upon the output signal, to a terminal for connection to a conductor under test;
- receiving a signal from the terminal; and
- detecting a length error of the conductor based upon the received signal.

\* \* \* \* \*